United States Patent
Wang et al.

(10) Patent No.: US 7,202,666 B2
(45) Date of Patent: Apr. 10, 2007

(54) MAGNETIC RESONANCE PARALLEL IMAGING METHOD WITH K-SPACE SENSITIVITY ENCODING

(75) Inventors: Jian Min Wang, Shenzhen (CN); Bida Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/364,676

(22) Filed: Feb. 28, 2006

(65) Prior Publication Data

US 2006/0208731 A1    Sep. 21, 2006

(30) Foreign Application Priority Data

Feb. 28, 2005   (CN) .......................... 2005 1 0008974

(51) Int. Cl.
 *G01V 3/00*  (2006.01)
(52) U.S. Cl. ...................... 324/309; 324/318
(58) Field of Classification Search ........ 324/300–322; 600/410–424
 See application file for complete search history.

(56) References Cited

U.S. PATENT DOCUMENTS

| | | | | |
|---|---|---|---|---|
| 6,717,406 B2 * | 4/2004 | Sodickson | ................... | 324/307 |
| 6,771,071 B1 * | 8/2004 | Wright et al. | ................ | 324/318 |
| 6,828,790 B2 * | 12/2004 | Katscher et al. | ............ | 324/318 |
| 6,841,998 B1 * | 1/2005 | Griswold | ..................... | 324/309 |
| 6,980,001 B2 * | 12/2005 | Paley et al. | .................. | 324/318 |
| 7,002,344 B2 * | 2/2006 | Griswold et al. | ........... | 324/309 |
| 7,034,530 B2 * | 4/2006 | Ahluwalia et al. | .......... | 324/309 |
| 7,053,613 B2 * | 5/2006 | Lin | ............................ | 324/307 |
| 7,102,348 B2 * | 9/2006 | Zhang et al. | ................ | 324/309 |

OTHER PUBLICATIONS

"SENSE: Sensitivity Encoding for Fast MRI," Pruessmann et al., Magnetic Resonance in Medicine, vol. 42 (1999) pp. 952-962.

* cited by examiner

Primary Examiner—Brij B. Shrivastav
(74) Attorney, Agent, or Firm—Schiff Hardin LLP

(57) ABSTRACT

In a K-space SENSitivity Encoding (KSENSE) magnetic resonance parallel imaging method the sensitivity distribution of MR reception coils; is calculated and based on the sensitivity of the coils, signals from the respective coil merging channels are merged. The merged data are used to perform k-space data fitting and optimal fitting parameters are found. The fitting parameters are used to remove artifacts in the reconstructed image. The KSENSE method, compared to SENSE, mSENSE and GRAPPA, has the advantages of the image reconstructed by KSENSE having an optimized signal-to-noise ratio (SNR) that is superior to that of an image reconstructed by GRAPPA under the same conditions and approximates that when mSENSE is used, and an image reconstructed by KSENSE has relatively low residual artifacts and an artifact intensity, as a whole, that is superior to that of an image reconstructed by SENSE or the like under the same conditions and equivalent to that when GRAPPA is used, and, compared to GRAPPA that also performs operations in k-space, KSENSE has a higher reconstruction speed.

21 Claims, 6 Drawing Sheets

FIG. 7
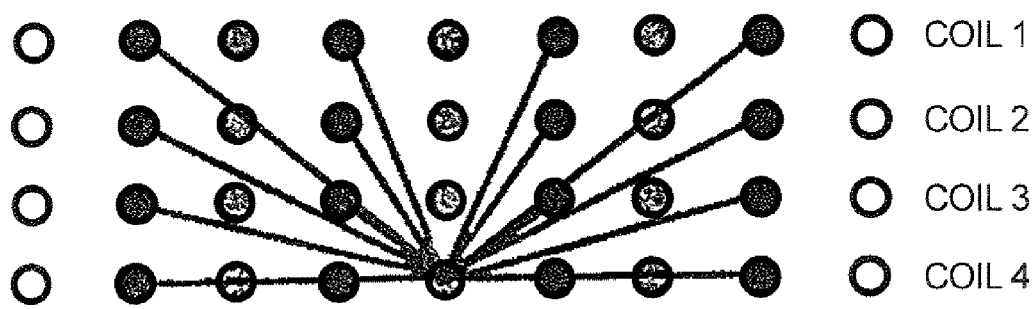
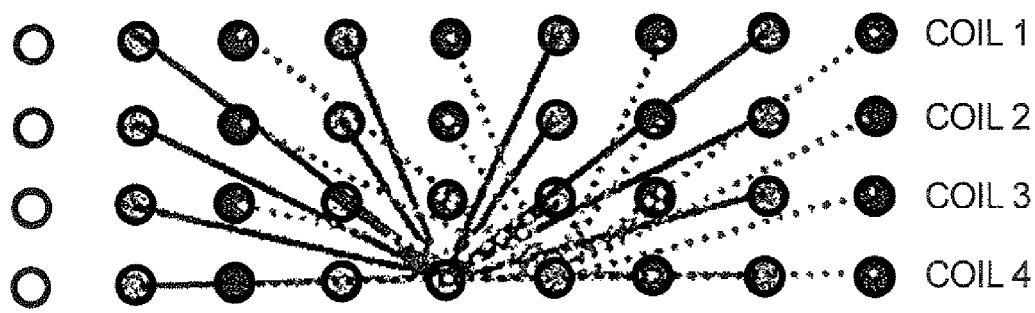
FIG. 8

MAGNETIC RESONANCE PARALLEL IMAGING METHOD WITH K-SPACE SENSITIVITY ENCODING

BACKGROUND OF THE INVENTION

1. Field of the Invention

The present invention relates to a magnetic resonance parallel imaging method, and more particularly to a magnetic resonance parallel imaging method for realizing K-space SENSitivity Encoding, therefore designated KSENSE.

2. Description of the Prior Art

There are many magnetic resonance parallel imaging methods, among which SENSitivity Encoding (SENSE) and GeneRalized Autocalibrating Partially Parallel Acquisitions (GRAPPA) are widely recognized to be two relatively successful techniques.

Magnetic resonance parallel imaging techniques are primarily used to solve the problem of image aliasing due to under-sampled signals in k-space. Such aliasing can be expressed as a linear process:

$$b = Ax \quad (1)$$

where x is an original image to be reconstructed, b is an image with aliasing correction, and A is an aliasing matrix. A is determined by the sensitivity distribution of coils. If A is known, the least-squares solution of the image can be calculated by finding the pseudo-inverse of A:

$$x' = A^+ b = (A^H \cdot A)^{-1} A^H b \quad (2)$$

which has the optimum signal-to-noise ratio (SNR) feature for sensitivity distribution that is measured accurately, where H represents a conjugate transpose operation. This constitutes the basic idea of the known SENSE reconstruction method.

In the radio frequency field, an object being imaged will affect the field distribution of coils as a load, hence generally there is a need for measuring the sensitivity distribution of coils in real time. The sensitivity distribution of the coils is typically a slow function of spatial positions. The auto-calibrating SENSE method obtains the sensitivity distribution of coils in real time by fully sampling in low frequency regions. Of course, the sensitivity distribution obtained in this manner is just an approximation of the actual sensitivity distribution. It should be noted that the sensitivity distribution is meaningful only for positions where signals from the object being measured are present. Therefore, in practical imaging, the high-frequency component of the sensitivity distribution of coils cannot be neglected, but it can not be detected using the technique of measuring the sensitivity by fully sampling in low frequency regions. As a result, at the edge of the object being imaged and in regions where the image phase changes relatively fast, the conventionally determined sensitivity distribution of the coils has a relatively large error. In positions where sensitivity is not accurate, the least-square solution will no longer have the features of optimum SNR and optimal solution. Thus, in such positions and in corresponding positions where aliasing occurs, there may appear a relatively obvious artifact and the SNR is relatively low, and such an artifact develops mainly for the reason that the measurement error of the sensitivity distribution of coils is enlarged during the reconstruction process.

Therefore, the SENSE method, which eliminates such an artifact in the image domain, has the feature of optimum SNR for the sensitivity distribution that is measured relatively accurately. In practice, however, image artifacts tend to appear at positions where the sensitivity distribution has a relatively large error and in corresponding positions where aliasing occurs. A modified SENSE method (mSENSE) based on the same principle has made some improvements in controlling image artifacts, but still fails to obtain satisfactory imaging effects due to limitation of its algorithms.

GRAPPA is typical of another kind of imaging technique for solving the problem of aliasing in k-space. Utilizing the spatial slow-changing characteristic of the sensitivity distribution, such techniques fit the sensitivity distribution of each channel into a spatial harmonic function. Multiplying the harmonic function by the collected signals to fill data that have not been collected has the effect of eliminating artifacts. This kind of technique does not need to calculate the sensitivity distribution of the coils, thereby avoiding image artifacts caused by a calculation error of the sensitivity.

Referring to FIG. 7, which illustrates an embodiment of the GRAPPA technique that fits using four channels (coils 1, 2, 3 and 4), where white points represent under-sampled data that have not been filled, gray points represent reference data that are collected additionally, and black points represent data obtained by intersampling in parallel acceleration mode. GRAPPA employs "black" data to fit "gray" data so as to calculate fitting parameters, and then employs the fitting parameters and black data collected to fit and obtain under-sampled white data. Although the fitting of the spatial harmonic cannot be absolutely accurate, in general, fitting errors in k-space, after being transformed into image domain, will not concentrate at a certain position, while artifact and noise resulting from reconstruction will be distributed in a relatively large region of image. Therefore, in some cases, artifact in images reconstructed using GRAPPA, when being observed visually, are less obvious compared to artifact caused when SENSE is used. Therefore, GRAPPA is more widely used in clinical and practical study.

Although GRAPPA performs all-channel and multiple-harmonic least-squares fitting, such fitting no longer has the feature of optimum SNR in image domain and the fitting parameters are relatively random. Therefore, compared to SENSE, GRAPPA has a lower overall SNR in the image domain.

In addition, in order to eliminate the phase-cancellation effect caused by directly adding multiple channels and to improve the stability of image reconstruction, GRAPPA employs a coil-by-coil fitting scheme, i.e., it performs the fitting operation on the image collected by each channel to remove artifact, and then merges the respective images by calculating the sum of squares (SOS) of moduli of respective images and extracting the square root of SOS. By contrast; SENSE only needs to perform the artifact-eliminating operation on one image. Therefore, although GRAPPA reduces the fitting error and improves the image quality, it requires a longer image reconstruction time and a lower reconstruction speed than SENSE since the time needed to fit full channel data is proportional to the number of channels.

Therefore, a problem in the field of magnetic resonance imaging in need of urgent resolution is to provide a magnetic resonance parallel imaging method which has an optimized SNR, relatively low image artifact and relatively high image reconstruction speed.

SUMMARY OF THE INVENTION

An object of the present invention is to provide a KSENSE magnetic resonance parallel imaging method which has an optimized SNR, relatively low image artifact and relatively high image reconstruction speed.

The above object is achieved in accordance with the present invention by a magnetic resonance parallel imaging method referred to herein as KSENSE, which includes the following steps:
(i) calculating the sensitivity distribution of MR reception coils each having an associated coil channel;
(ii) based on the calculated sensitivity of the coils, merging the received MR signals from the respective coil channels to obtain merged data;
(iii) using the merged data to perform data fitting in k-space, and finding optimal fitting parameters; and
(iv) reconstructing an image using the fitting parameters to remove artifacts in the image produced from the k-space data.

In step (i), the sensitivity distribution of the coils is calculated as follows: Using fully sampled data of respective channels in k-space, the filtering operation and Fourier transformation are performed to obtain low resolution images of respective channels, and the sum square root of the sum of the squares (SOS) of moduli of the low resolution images of respective channels is calculated. The sensitivity of each coil is equal to the low resolution image of the corresponding channel divided by the reference image based on the merging via sum of squares. In step (i), phased sum method is used to appropriately adjust phases of respective channels so that the SNR of the merged image is optimized. The method of phased sum method includes calculating the low resolution images of respective channels; and then calculating the phase in one position of the image, assigning a negative sign to the phase angle of the phase, and weighting the low resolution image of each channel with the so-processed phase. The phased sum image is obtained by calculating the sum of the weighted images, with the sensitivity of each coil being equal to the low resolution image of the corresponding channel divided by the reference image based on the merging via sum of squares and then by the phase of the phased sum image.

In step (ii), the merging of channels is performed as follows. Based on the sensitivity of coils, k-space data of respective channels are merged into r virtual channels, wherein r is an acceleration factor for sampling, with the merged data, after being transformed into image domain, having an optimized SNR in field of view (FOV) of the virtual channels thereof, and the sensitivity function expressed in k-space having a relatively small convolution kernel. In one embodiment, the channel merging can be performed in k-space as follows. The sensitivity distribution is processed appropriately and the sensitivity distribution is then transferred into k-space. The convolution of the sensitivity distribution and the original k-space data for each channel is calculated, which are then added to obtain r virtual channels, with the merged data, after being transformed into image domain, having an optimized SNR in field of view of virtual channels thereof, and, at the same time, reference data lines in the k-space data are also merged in the same way. In another embodiment, the channel merging is performed in the image domain by multiplying the image spaces directly. In another embodiment, the merged virtual channels are a linear combination of the r virtual channels.

In step (iii), in an embodiment, in order to increase stability for finding a solution, data collected in a partially parallel mode are incorporated into an equation to be solved with the fitting parameters as a known condition. In another embodiment, a weighted least-square method (WLS) is used to suppress some regions that tend to make the fitting parameters unstable. In another embodiment, a least-squares method is used to calculate the fitting parameters. In another embodiment, a method of finding the inverse by singular value decomposition is used to calculate the fitting parameters. In another embodiment, besides selecting the r virtual channels, some or all actual channels are added to fit data together so that the fitting is more stable and image artifact is further reduced. In another embodiment, the data fitting in k-space of step (iii) can employ one-dimensional fitting or two-dimensional fitting.

In step (iv), in one embodiment, a final image is restricted and output directly by transforming the fitting parameters into image domain and then performing the aliasing-eliminating operation in the image domain. In another embodiment, data that are collected in parallel mode are used to fit data that are not collected, that is, under-sampled data are filled in k-space, followed by a further step (v) of transforming fully sampled data obtained via fitting and filling into image domain and merging the fully sampled data into an image that is available for output. The image merging can be performed by calculating the sum of the square root of the squares (SOS) of moduli of respective images, or by piecing together images in different fields of view.

Compared to SENSE, mSENSE and GRAPPA, the KSENSE magnetic resonance parallel imaging method according to the present invention has the following advantages:

1) an image reconstructed by KSENSE has an optimized SNR that is superior to that of an image reconstructed by GRAPPA under the same conditions and approximates to that when mSENSE is used;

2) an image reconstructed by KSENSE has relatively low residual artifact whose artifact intensity, as a whole, is superior to that of an image reconstructed by SENSE or the like under the same conditions and equivalent to that when GRAPPA is used; and, 3) KSENSE, compared to GRAPPA that also performs operations in k-space, has a higher reconstruction speed.

DESCRIPTION OF THE DRAWINGS

FIGS. 4A–4D show reconstructed images of another embodiment of each of mSENSE, GRAPPA and KSENSE, respectively.

FIG. 7 is a schematic diagram of an embodiment of GRAPPA using four channels.

FIG. 8 is a schematic diagram of an embodiment of KSENSE according to the present invention.

DESCRIPTION OF THE PREFERRED EMBODIMENTS

The discussion below presumes a knowledge of the SENSE and GRAPPA pulse sequences. Details of the SENSE sequence can be found in Prüssmann et al., "SENSE: Sensitivity Encoding for Fast MRI," Magnetic Resonance in Medicine 42(5), pages 952–962 (1999), the teachings of which are incorporated herein by reference. Details of the GRAPPA sequence can be found in U.S. Pat. No. 6,841,998, the teachings of which are incorporated herein by reference.

Figure 1:
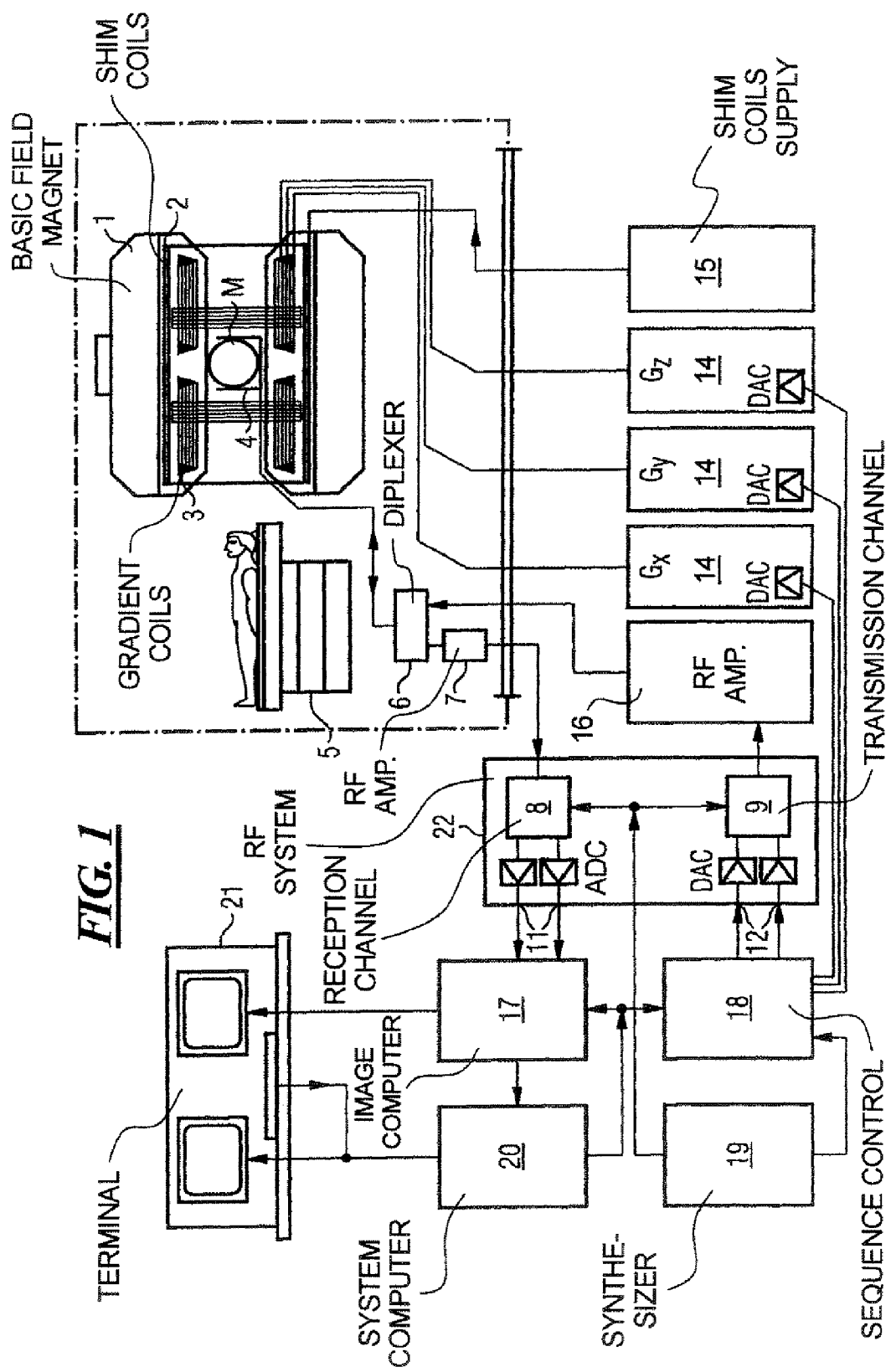
FIG. 1 schematically illustrates a magnetic resonance tomography apparatus operable in accordance with the present invention.

FIG. 1 is a schematic illustration of a magnetic resonance imaging apparatus operable using KSENSE according to the present invention. The arrangement of the components of the magnetic resonance imaging apparatus is the same as that of a conventional magnetic resonance imaging apparatus, but it is operable in a non-conventional manner, as described below. A basic field magnet 1 generates a strong, time invariant, basic magnetic field that polarizes, i.e., aligns the nuclear spins in the zone of the object, such as a part of the human body, to be scanned. The high degree of homogeneity of the magnetic field required for magnetic resonance imaging is defined within a sphere-like volume M, into which the relevant region of the patient's body must be brought. In order to meet the homogeneity requirements, and especially to eliminate any time invariant influences, the shim plates (made of a ferromagnetic material) are placed in suitable position. Time-variable influences are eliminated by shim coils 2 that are driven by a shim power supply 15.

A cylindrical gradient coil system 3 that consists of three windings, is integrated in the basic field magnet 1. Each winding is driven by an amplifier 14 to generate a linear gradient field in a defined direction of the Cartesian coordinate system. The first winding of the gradient field system 3 generates a slice-selection gradient $G_L$, the second sub-winding generates a frequency-coding gradient $G_F$, and the third winding generates a phase-coding gradient $G_P$. According to the present invention, in coronary projection, the frequency-coding gradient $G_F$ is oriented left-to-right in relation to the patient, while the two other gradients—the slice-selection gradient $G_L$ and the phase-coding gradient $G_P$—are applied along the longitudinal axis of the body. The reason for this non-conventional arrangement of the gradients according to the invention will be explained in more detail below.

Furthermore, each amplifier 14 includes a digital-to-analog converter that is operated by a sequence control 18 to generate gradient pulses at the right time.

The gradient field system 3 also physically supports a radio-frequency antenna 4 that converts the radio-frequency pulses generated by a radio frequency power amplifier 13 into a pulsating electromagnetic field in order to excite the nuclei and to align the nuclear spins of the object or part of the object to be scanned. The radio-frequency antenna 4 also converts the pulsating electromagnetic field emanating from the nuclear spins (i.e., usually nuclear spin echo signals caused by a pulse sequence consisting of one or more radio-frequency pulses and one or more gradient pulses) into a voltage that is fed through an amplifier 7 into a radio-frequency reception channel 8 of a radio-frequency system 22. The radio-frequency system 22 also includes a transmission channel 9, which generates the radio-frequency pulses that excite the nuclear magnetic resonance signals. In response to a pulse sequence defined by the system computer 20, the relevant radio-frequency pulses are represented in the sequence control 18 digitally, as a sequence of complex numbers. This sequence of numbers is then fed—as real and imaginary parts—through inputs 22 into a digital-to-analog converter in the radio-frequency system 22 and from this converter, into the transmission channel 9. In the transmission channel 9, the pulse sequences are modulated onto a radio-frequency carrier signal, having a base frequency matching the resonant frequency of the nuclear spins in the scanned section.

The switch between transmission and reception occurs by means of a transmit/receive diplexer switch 6. The radio-frequency antenna 4 radiates radio-frequency pulses into the scanned section to excite nuclear spins and then receives the resulting echo signal. The magnetic resonance signals thus obtained are phase-sensitively demodulated in the reception channel 8 of the radio-frequency system 22, and are converted by respective analog-to-digital converters into real and imaginary parts of the measurement signal. Using the magnetic resonance data obtained in this way, a computer 17 reconstructs an image. The system computer 20 controls the obtained magnetic resonance data, image data, and the control programs. Using parameters pre-defined by the control programs, the sequence control 18 controls the generation of the desired pulse sequences and the corresponding scanning of k-space. The sequence control 18 is especially important for controlling the proper switching of the gradients in time, the transmission of radio-frequency signals with the defined phase and amplitude, and the reception of the magnetic resonance signals. The time base for the radio-frequency system 22 and the sequence control 18 is provided by a synthesizer 19. The configuration of the MRI apparatus, the selection of proper control programs to generate a magnetic resonance image, and the display of the produced magnetic resonance image are performed via a terminal (console) 21, which includes a keyboard and one or more monitors.

The K-space SENSitivity Encoding (KSENSE) magnetic resonance parallel imaging method according to the present invention combines advantages of SENSE and GRAPPA but avoids disadvantages thereof.

Figure 2A:
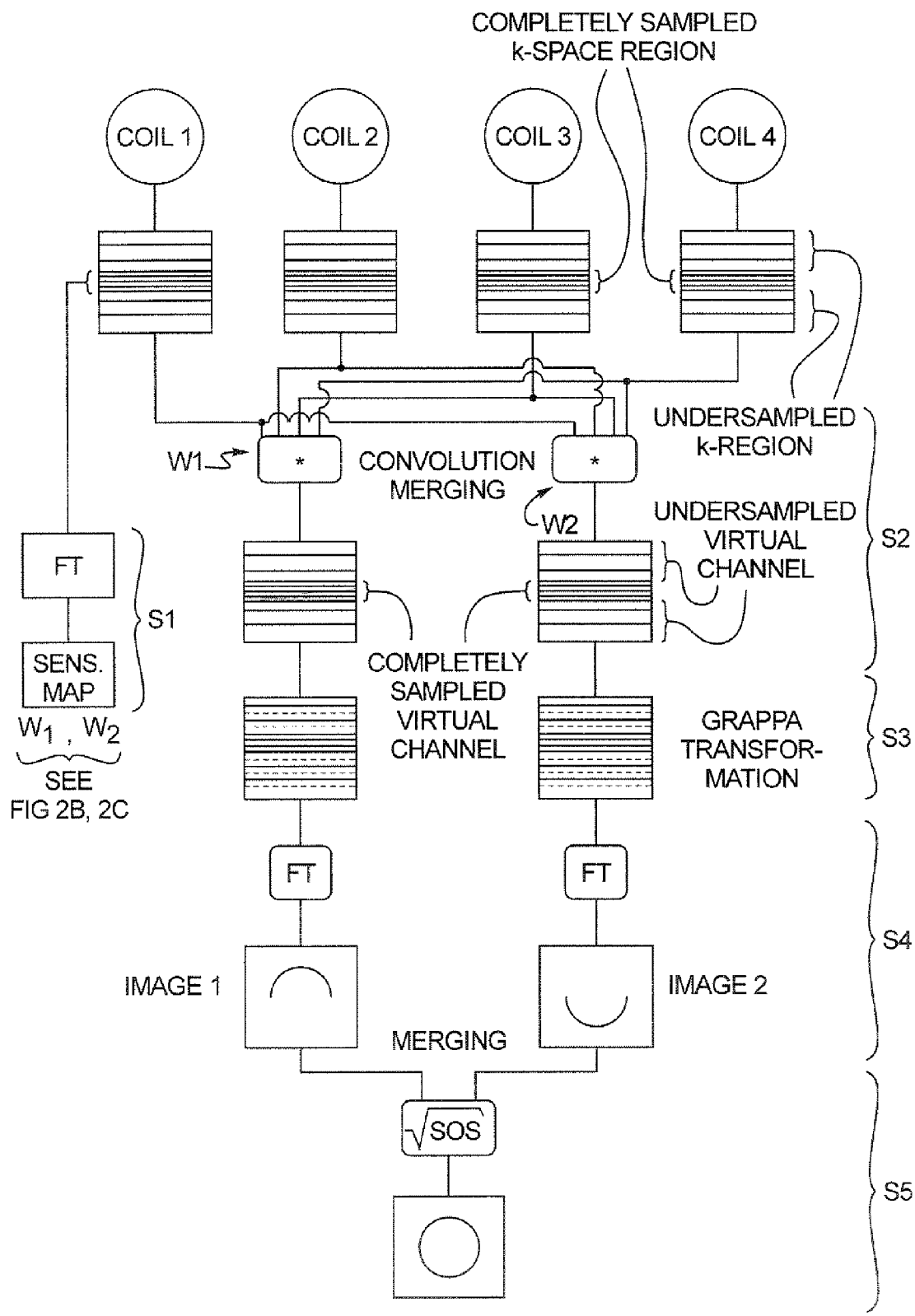
FIGS. 2A–2C schematically illustrate an embodiment of KSENSE according to the present invention in a three-component flowchart.

In the example shown in FIG. 2A, four sensitivity coils of a four component coil array (coil, 1, coil 2, coil 3, coil 4) are used, each of these coils having well-defined sensitivity distribution. Four regions of k-space are sampled simultaneously with these four coils. K-space is only completely sampled in the central areas of the regions, and the adjacent areas will be undersampled.

Figure 2B:
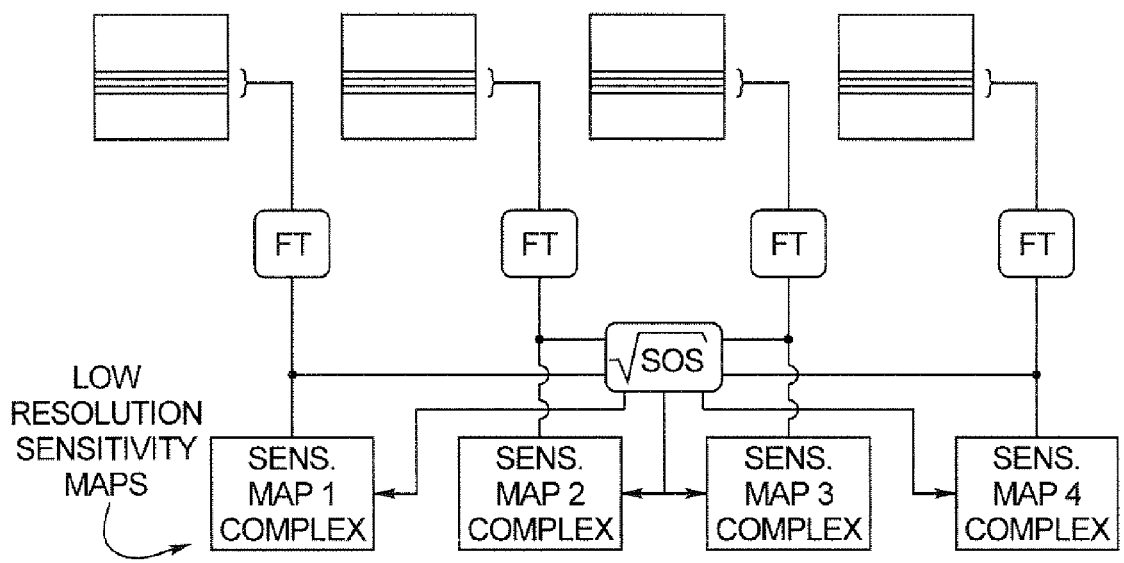

In step S1 (FIGS. 2B and 2C) all pixels of each completely sampled k-space region of a respective coil are Fourier-transformed, followed by a magnitude reconstruction procedure, e.g. a Sum-Of-Square (SOS) algorithm, to obtain complex low resolution sensitivity maps of each coil: Sens. Map 1, Sens. Map 2, Sens. Map 3, and Sens. Map 4.

Figure 2C:
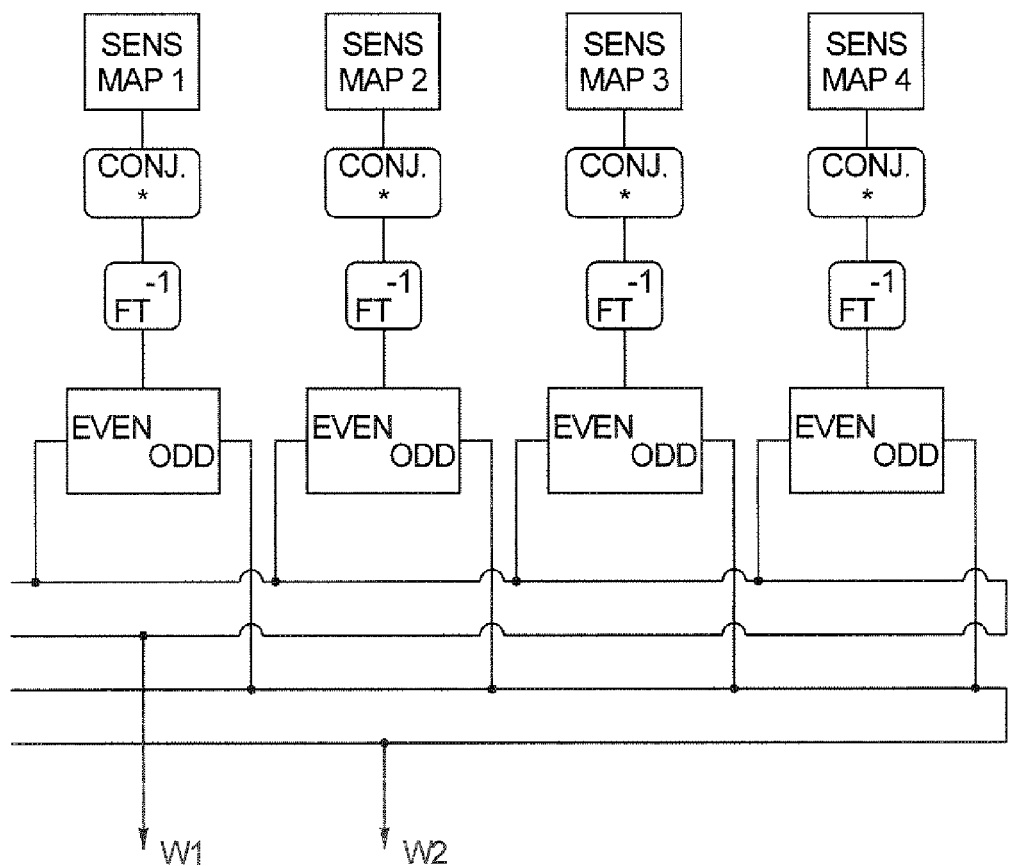

Each Sensitivity Map (which is complex) will be conjugated (conj.*) and then Fourier-back transformed ($FT^{-1}$), providing a map in k-space composed of even and odd k-space lines (FIG. 2C). All even k-space lines of all maps are used to produce a weighting function w1. All are used to produce a weighting function w2. The weighting function w1 and w2 define different kinds of convolution-kernels. Both kernels defined by w1 and w2 enable, in a step S2 (FIG. 2A), a channel-merging from the four originally partially undersampled k-space regions down to two virtually partially undersampled channels by convolution.

The completion of each undersampled virtual channel, in a step S3, is performed by the well known GRAPPA-algorithm. GRAPPA uses multiple k-space lines from all virtual channels (virtual coils) to fit one single coil (one single virtual channel) ACS line, resulting in a further increased accuracy of the fit procedure and therefore in a better artifact suppression.

When GRAPPA-Transformation is performed for each virtual channel, each GRAPPA-completed virtual channel is Fourier-transformed in step S4, leading to two different images in the image domain (Image 1 and Image 2). Each of these images by itself is incomplete.

In a step S5 both incomplete images are merged by a sum-of-square algorithm to hold a complete image with a high SNR and a low artifact level.

The basic image reconstruction process in accordance with the invention includes:

(S1) calculating sensitivity distribution of coils, with the reference image with contrast having an optimized SNR;

(S2) based on the sensitivity of coils, merging k-space data of respective channels into r virtual channels, wherein r is an acceleration factor for sampling, with the merged data, after being transformed into image domain, having an optimized SNR in field of view of virtual channels thereof;

(S3) using fully sampled data of the merged r virtual channels to perform data fitting in k-space, and finding optimal fitting parameters;

(S4) using the fitting parameters to remove image artifacts and reconstructing an image from the k-space data; and (S5) merging the images.

Operations performed in steps (S1) and (S2) in KSENSE are similar to that of SENSE, so that the reconstructed image has an optimized SNR and a relatively high reconstruction speed is obtained, whereas operations performed in steps (iii)–(v) of KSENSE are similar to GRAPPA, and hence KSENSE also obtains relatively low image artifact since the artifact-removing operation is performed in k-space.

In the following, KSENSE according to the present invention will be described as to a particular embodiment thereof.

Step one: calculating sensitivity distribution of coils, with the reference image with contrast having an optimized SNR.

In the prior art, the image reconstruction process of SENSE (as described by formula two) can be divided into two steps:

i) performing channel merging in image domain to obtain r aliasing images with optimized SNRs, namely, $$b' = A^H b \qquad (3)$$

where r is an acceleration factor for parallel acquisitions; and, ii) calculating the inverse and removing artifact, namely, $$x' = (A^* \cdot A)^{-1} b' \qquad (4)$$

Step S1 of KSENSE is similar to the prior art SENSE, and, to be specific, calculating the coil sensitivity based on a sum-of-squares image comprises: intercepting fully sampled data of respective channels in k-space, performing filtering operation and Fourier transform to obtain low resolution images of respective channels, calculating the sum of squares (SOS) of moduli of the low resolution images of respective channels and extracting the square root of SOS:

$$Im\, a_{SOS} = \sqrt{\sum_{iCh-1}^{nCh} Im\, a_{iCh} \cdot Im\, a_{iCh}^*} \qquad (5)$$

and, obtaining the sensitivity distribution of each coil by point-dividing the low resolution image of each channel by $Im a_{SOS}$.

In this step, phases of respective channels can be further adjusted appropriately so that the SNR of the merged image is optimized. In this embodiment, a phased sum method is used to achieve said optimization. More specifically, in order to optimize the SNR of the image in one position, calculating low resolution images of respective channels are calculated and then the phase in this one position is calculated, for example, the central position. A negative sign is given to the phase angle. The low resolution image of each channel with the processed phase in this manner is weighted, a phased sum image is obtained by calculating the sum of the weighted images as follows:

$$Im\, a_{Phase} = \sum_{iCh-1}^{nCh} \exp(-i.a_{ich}) \cdot Im\, a_{iCh} \qquad (6)$$

In this case, the sensitivity distribution of each coil is equal to the low resolution image of each channel divided by $Im a_{SOS}$ and then point-divided by the phase of $Im a_{phase}$:

$$P_{iCh} = Im a_{iCh}/Im a_{SOS} \cdot \exp(i * \angle Im a_{PhaseSum}) \qquad (7)$$

where $P_{iCh}$ is the sensitivity distribution of the coil iCh, $Im a_{iCh}$ is the low resolution image of the coil iCh, $Im a_{SOS}$ is the image via SOS of the low resolution images, and $Im a_{PhaseSum}$ is the phased sum image of the low resolution images.

Step S2: based on the sensitivity of coils, merging k-space data of respective channels into r virtual channels, where r is an acceleration factor for sampling, with the merged data, after being transformed into image domain, having an optimized SNR in field of view of virtual channels thereof, and the sensitivity function expressed in k-space having a relatively small convolution kernel.

The channel merging of this step can be achieved by many methods, among which three methods will be described in this embodiment.

The first method is to perform the channel merging in k-space by the following: processing the sensitivity distribution appropriately and then transforming the sensitivity distribution into k-space, calculating, respectively, the convolution of the sensitivity distribution and original k-space data of respective channels which is then added together to obtain r virtual channels, with the merged data, after being transformed into image domain, having an optimized SNR in field of view of virtual channels thereof and, at the same time, reference data lines (number thereof is assumed to be nRef) in the k-space data also need to be merged in the same way. If there are nCh channels and the acceleration factor is two, then the sensitivity distribution map of each channel can be divided into an upper half portion and a lower half portion based on the acceleration factor. The upper and lower half portions can be regarded as the field of view of two merged virtual channels. Then, the upper half portion of the sensitivity distribution map of each channel is pieced with itself and the lower half portion of the sensitivity distribution map of each channel is also pieced with itself. Thus, the original nCh sensitivity distribution maps are converted to 2×nCh maps, and the 2×nCh maps, after being transformed into k-space, are filtered, truncated into small convolution kernels, convoluted, respectively, with the original k-space data of corresponding channels, and merged in accordance with the field of view of the virtual channels. Finally, data of the two virtual channels can be obtained.

The second method is to perform the channel merging in image domain: transforming the convolution kernels of the k-space into image domain, and realizing the channel merging by multiplying image spaces directly.

The third method is to perform the channel merging by using linear combination of the r virtual channels with optimized SNRs in the first channel merging method.

Step S3: using full-sampled data of the r merged virtual channels to perform data fitting in k-space, and finding optimal fitting parameters.

Steps S3 and S4 of KSENSE are equivalent to the second step of realizing SENSE in k-space, and particular implementation thereof is similar to GRAPPA but makes some improvement. Said data fitting and finding optimal fitting parameters of this step can be achieved by many methods, five of which will be described in the embodiment.

In the first method, data collected in parallel mode are also incorporated into an equation of fitting parameters as reference data for fitting, so as to improve the stability of fitting. Referring to FIG. 1, in general, linear combination of the data collected in parallel mode (black points) is used to fit additionally-collected reference data (gray points), and the coefficients thereof are exactly the fitting coefficients for the fitting. The equation is shown as follows:

$$S^{PPA} \cdot n = S^{Ref} \qquad (8)$$

Referring to FIG. 2, in order to increase stability for finding a solution, KSENSE incorporates data collected in partially parallel mode (black points) into an equation to be solved of the fitting parameters as a known condition:

$$S^{KSENSE} \cdot n = S^{Ref} \qquad (9)$$

In this way, if the acceleration factor is two, then the number of known conditions is increased to 2×nRef−nBlock+1 from the original nRef, where nBlock is number of data lines used to fit by each channel and it is 4 in FIG. 1.

In the second method, since in practice, fitting parameters calculated using reference data lines in some positions (for example, the central reference data line) are not typical, KSENSE introduces the weighted least-square method (WLS) to suppress some regions that tend to make the fitting parameters unstable by the formula:

$$n = (S^{KSENSE} \cdot W S^{KSENSE})^{-1} S^{KSENSE} \cdot W S^{Ref} \qquad (10)$$

The third method is to calculate the fitting parameters by employing the least-square method:

$$n = (S^{KSENSE} \cdot S^{KSENSE})^{-1} S^{KSENSE} \cdot S^{Ref} \qquad (11)$$

In the fourth method, in order to improve the stability for finding a solution, the fitting parameters are calculated by the method of finding inverse via singular value decomposition.

In various methods used in the step, n is the fitting parameters, $S^{KSENSE}$ is the data used to fit, $S^{Ref}$ is the fitted reference data, and W is weighting. Despite the fact that the data fitting in k-space of the r virtual channels is not completely equivalent to formula four, with the concept of channel merging being introduced and such channel merging having the feature of optimized SNR, KSENSE is superior to GRAPPA and approximates to SENSE as far as the SNR of a reconstructed image is concerned.

Because KSENSE uses only r virtual channels in the third step, it can accelerate the image reconstruction when the actual number of channels is larger than the acceleration factor r, and such an advantage becomes greater as the actual number of channels increases.

In the fifth method, during the process of fitting data, besides the standard mode of selecting the r virtual channels to fit, KSENSE can also flexibly use interconnected portions or all actual channels to fit data. Such data fitting is more stable and facilitates further reduction of image artifact.

In addition, KSENSE can also flexibly employ two-dimensional fitting schemes. However, from the actual results of data reconstruction, one-dimensional fitting is already capable of achieving a relatively satisfactory effect.

Step S4 using the fitting parameters to remove artifact.

This step can be achieved by the following two methods.

The first is to transform the fitting parameters into image domain and then perform aliasing-eliminating operation, that is, a final image can be obtained at one stroke and output directly.

In the second method, with the fitting parameters known, data that are not collected can be fitted by using data that are collected in parallel mode, that is, under-sampled data are filled in k-space.

Step S5: merging images.

If, in step S4 of KSENSE, the first method is used, namely transforming the fitting parameters into image domain and then performing aliasing-eliminating operation, then the final image can be obtained and output directly. In this case, step S5, as a separately defined step, is not needed.

If, in step S4 of KSENSE, the second method is used, that is, under-sampled data are filled in k-space, then, fully sampled data obtained via fitting and filling can be transformed into image domain and merged into an image that is available for output. Wherein the image merging can be realized by calculating the sum of squares (SOS) of moduli of respective images and extracting the square root of SOS, or by piecing together images in different fields of view.

Figure 3A:
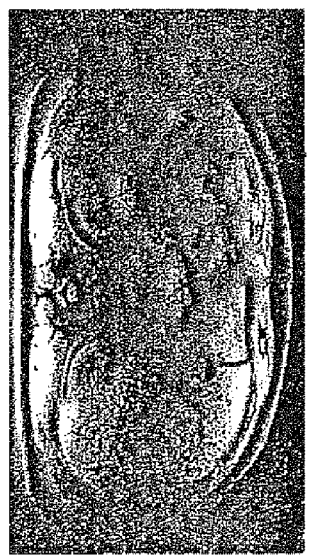
FIGS. 3A–3C show reconstructed images obtained with mSENSE, GRAPPA and KSENSE, respectively.
Figure 3B:
Figure 3C:
Figure 4A:
Figure 4B:
Figure 4C:

Referring to FIGS. 3A–3C and 4A–4C, in which an image reconstructed in a 1.5T system using data collected by four-channel coil in double acceleration mode is illustrated, wherein FIGS. 3A–3C show reconstructed images of first embodiment of mSENSE, GRAPPA and KSENSE, respectively, and FIGS. 4A–4C show reconstructed images of another embodiment of mSENSE, GRAPPA and KSENSE, respectively. From the above-mentioned figures, it can be seen clearly that, as a whole, KSENSE results in image artifact that is smaller than or approximates to that when GRAPPA is used.

Figure 5A:
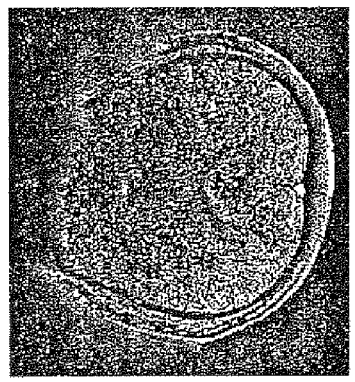
FIGS. 5A–5C show reconstructed images of yet another embodiment of each of mSENSE, GRAPPA and KSENSE, respectively.
Figure 5B:
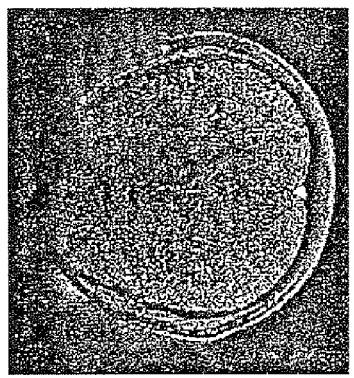
Figure 5C:
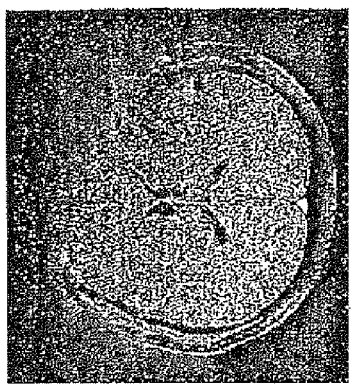
Figure 6A:
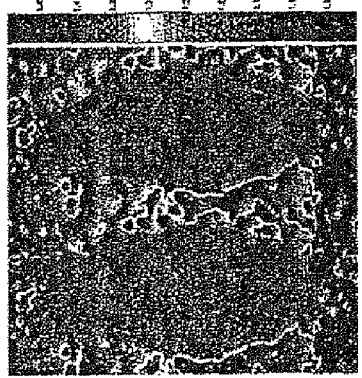
FIGS. 6A–6C show respective distribution maps of the g factor for the reconstructed images in FIGS. 5A–5C.
Figure 6B:
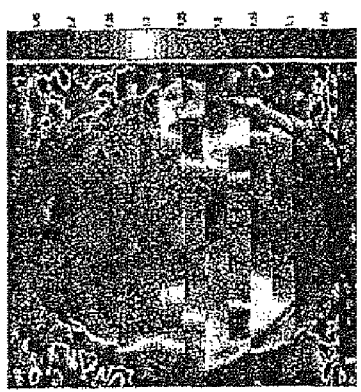
Figure 6C:
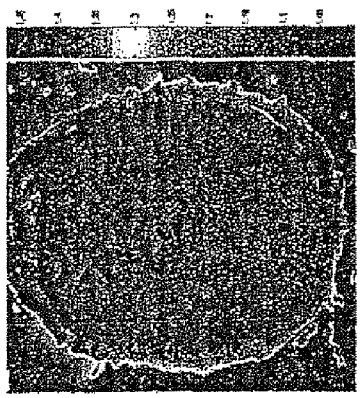

Referring to FIGS. 5A–5C and 6A–6C, in which a reconstruction result obtained in a 3T system using data collected by eight-channel coil in double acceleration mode is illustrated, wherein FIGS. 5A–5C show reconstructed images of yet another embodiment of mSENSE, GRAPPA and KSENSE, respectively, and FIGS. 6A–6C show respective distribution maps of g factor of reconstructed images in FIGS. 5A–5C. From the above-mentioned figures, it can be seen clearly that KSENSE has an optimized SNR when compared to GRAPPA and has relatively low image artifact when compared to SENSE.

FIG. 8 illustrates the embodiment of KSENSE using four coils, in a manner comparable to the illustration of GRAPPA in FIG. 7, for comparison.

In conclusion, compared to SENSE, mSENSE and GRAPPA, the KSENSE magnetic resonance parallel imaging method according to the present invention has the following advantages:

1) an image reconstructed by KSENSE has an optimized SNR that is superior to that of an image reconstructed by GRAPPA under the same conditions and approximates to that when mSENSE is used;

2) an image reconstructed by KSENSE has relatively low residual artifact whose artifact intensity, as a whole, is superior to that of an image reconstructed by SENSE or the like under the same conditions and equivalent to that when GRAPPA is used; and, 3) KSENSE, compared to GRAPPA that also performs operations in k-space, has a higher reconstruction speed.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance parallel imaging method using k-space sensitivity encoding, comprising the steps of:
   (i) calculating a sensitivity distribution for a plurality of MR reception coils in an array that simultaneously sample respective regions of k-space, each coil having an associated coil channel;
   (ii) based on the sensitivity of said coils, merging data from the respective channels to obtain merged data;
   (iii) using the merged data to perform data fitting in k-space, and finding optimal fitting parameters; and
   (iv) reconstructing an image by transforming k-space and using the fitting parameters to remove artifacts in the image.

2. The magnetic resonance parallel imaging method as claimed in claim 1 comprising, in step (i), using a reference image with an optimized signal-to-noise ratio to calculate the sensitivity distribution.

3. The magnetic resonance parallel imaging method as claimed in claim 2, comprising reconstructing said image, by intercepting fully sampled data of respective channels in k-space, performing a filtering operation and Fourier transformation to obtain low resolution images of respective channels, calculating a sum of squares (SOS) of moduli of the low resolution images of respective channels and extracting the square root of SOS, to obtain a reference image based on the merging via sum of squares, and processing the merged image to have an optimized SNR, wherein the sensitivity of each coil is equal to the low resolution image of the corresponding channel divided by the reference image based on the merging via sum of squares.

4. The magnetic resonance parallel imaging method as claimed in claim 2, comprising using a phased sum method to adjust phases of respective channels so that the SNR of the merged image is optimized.

5. The magnetic resonance parallel imaging method as claimed in claim 4, wherein the phased sum method comprises: calculating the low resolution images of respective channels; calculating the phase in one position of the image, adding a negative sign before the phase angle of the phase, and weighting the low resolution image of each channel with the so-processed phase; and obtaining a phased sum image by calculating the sum of the weighted images, wherein the sensitivity of each coil is equal to the low resolution image of the corresponding channel divided by the reference image based on the merging via sum of squares and then by the phase of the phased sum image.

6. The magnetic resonance parallel imaging method as claimed in claim 5, comprising using the central position of the image as said one position.

7. The magnetic resonance parallel imaging method as claimed in claim 1, wherein in step (ii), merging said channels comprises: based on the sensitivity of coils, merging k-space data of respective channels into r virtual channels, wherein r is an acceleration factor for sampling, with the merged data, after being transformed into image domain, having an optimized SNR in the field of view of virtual channels thereof, and the sensitivity function expressed in k-space having a relatively small convolution kernel.

8. The magnetic resonance parallel imaging method as claimed in claim 7, wherein merging said channels is performed in k-space by processing the sensitivity distribution appropriately and then transforming the sensitivity distribution into k-space, calculating, respectively, convolution of the sensitivity distribution and original k-space data of respective channels which is then added together to obtain r virtual channels, with the merged data, after being transformed into image domain, having an optimized SNR in the field of view of virtual channels thereof; and, at the same time, reference data lines in the k-space data are also merged in the same way.

9. The magnetic resonance parallel imaging method as claimed in claim 7, wherein merging said channels is performed in the image domain by multiplying image spaces directly.

10. The magnetic resonance parallel imaging method as claimed in claim 7, wherein the merged virtual channels are a linear combination of said r virtual channels.

11. The magnetic resonance parallel imaging method is claimed in claim 1 comprising, in step (iii) employing data fitting in k-space selected from the group consisting of one-dimensional fitting and two-dimensional fitting.

12. The magnetic resonance parallel imaging method as claimed in claim 1, comprising, in step (iii), in order to increase stability for finding a solution, incorporating data collected in partially parallel mode into an equation to be solved with the fitting parameters as a known condition.

13. The magnetic resonance parallel imaging method as claimed in claim 1 comprising, in step (iii), using a weighted least square method to suppress regions tending to make the fitting parameters unstable.

14. The magnetic resonance parallel imaging method as claimed in claim 1 comprising, in step (iii), using a least square method to calculate the fitting parameters.

15. The magnetic resonance parallel imaging method as claimed in claim 1 comprising, in step (iii), using a method of finding the inverse via singular value decomposition to calculate the fitting parameters.

16. The magnetic resonance parallel imaging method as claimed in claim 1 comprising, in step (iii), adding a part of or all actual channels fit data together so that the fitting is more stable and image artifacts are further reduced.

17. The magnetic resonance parallel imaging method as claimed in claim 1 comprising, in step (iv), obtaining and outputting a final image by transforming the fitting parameters into the image domain and then performing an aliasing-eliminating operation in the image domain.

18. The magnetic resonance parallel imaging method as claimed in claim 1 comprising, in step (iv), using data that are collected in a parallel mode to fit data that are not collected, by filling in k-space with under-sampled data.

19. The magnetic resonance parallel imaging method as claimed in claim 18, comprising: (v) transforming fully sampled data obtained via fitting and filling into the image domain and merging the fully sampled data into an image that is available for output.

20. The magnetic resonance parallel imaging method as claimed in claim 19, comprising performing the image merging by calculating a sum of squares (SOS) of moduli of respective images and extracting the square root of SOS.

21. The magnetic resonance parallel imaging method as claimed in claim 19, comprising performing the image merging by piecing together images in different fields of view.

* * * * *